(12) United States Patent
Garner

(10) Patent No.: US 7,071,408 B2
(45) Date of Patent: *Jul. 4, 2006

(54) THERMAL MANAGEMENT SYSTEM AND METHOD FOR ELECTRONICS SYSTEM

(75) Inventor: Scott D. Garner, Lititz, PA (US)

(73) Assignee: Thermal Corp., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/218,747

(22) Filed: Sep. 2, 2005

(65) Prior Publication Data

US 2006/0005980 A1 Jan. 12, 2006

Related U.S. Application Data

(63) Continuation of application No. 10/658,828, filed on Sep. 9, 2003, now Pat. No. 6,972,365, which is a continuation of application No. 10/180,166, filed on Jun. 26, 2002, now Pat. No. 6,657,121.

(60) Provisional application No. 60/301,224, filed on Jun. 27, 2001.

(51) Int. Cl.
*H05K 7/20* (2006.01)

(52) U.S. Cl. .................................. 174/16.3
(58) Field of Classification Search ............... 174/16.3; 361/702
See application file for complete search history.

(56) References Cited

U.S. PATENT DOCUMENTS

| 3,317,798 | A | 5/1967 | Chu et al. |
| 3,387,648 | A | 6/1968 | Ward, Jr. et al. |
| 4,323,914 | A | 4/1982 | Berndlmaier et al. |
| 4,366,526 | A | 12/1982 | Lijoi et al. |
| 4,602,679 | A | 7/1986 | Edelstein et al. |
| 4,793,405 | A | 12/1988 | Diggelmann et al. |
| 4,931,905 | A | 6/1990 | Cirrito et al. |
| 4,941,530 | A | 7/1990 | Crowe |
| 4,949,164 | A | 8/1990 | Ohashi et al. |

(Continued)

FOREIGN PATENT DOCUMENTS

JP 05328230 A 12/1993

(Continued)

OTHER PUBLICATIONS

Chrysler et al., "Enhanced Thermosyphon Cooling System", IBM Technical Disclosure Bulletin, vol. 37, No. 10, Oct. 1994, pp. 11-12.

*Primary Examiner*—Chau N. Nguyen
(74) *Attorney, Agent, or Firm*—Duane Morris LLP

(57) ABSTRACT

A thermal energy management system is provided having a heat spreading device that is operatively engaged with at least one semiconductor chip and a thermal bus operatively engaged with the heat spreading device so as to transport thermal energy from the heat spreading device to a heat sink. The heat spreading device includes a heat pipe and the thermal bus includes a loop thermosyphon. A second thermal bus may be operatively engaged with the first-thermal bus so as to transport thermal energy from the first thermal bus to a heat sink. The second thermal bus may also include a loop thermosyphon. A method of managing thermal energy in an electronic system is also provided that includes spreading thermal energy generated by one or more devices over a surface that is relatively larger than the devices, thermally coupling an evaporator portion of a loop thermosyphon to the surface, and thermally coupling a condensing portion of the loop thermosyphon to a thermal energy sink, e.g., a second loop thermosyphon, convection fin, or cold plate.

13 Claims, 4 Drawing Sheets

U.S. PATENT DOCUMENTS

| | | |
|---|---|---|
| 5,003,376 A | 3/1991 | Iversen |
| 5,063,475 A | 11/1991 | Balan |
| 5,077,601 A | 12/1991 | Hatada et al. |
| 5,150,278 A | 9/1992 | Lynes et al. |
| 5,203,399 A | 4/1993 | Koizumi |
| 5,283,715 A | 2/1994 | Carlsten et al. |
| 5,329,425 A | 7/1994 | Leyssens et al. |
| 5,331,510 A * | 7/1994 | Ouchi et al. ................ 361/702 |
| 5,361,188 A | 11/1994 | Kondou et al. |
| 5,513,071 A | 4/1996 | LaViolette et al. |
| 5,587,880 A | 12/1996 | Phillips et al. |
| 5,613,552 A | 3/1997 | Osakabe et al. |
| 5,713,413 A | 2/1998 | Osakabe et al. |
| 5,720,338 A | 2/1998 | Larson et al. |
| 5,832,989 A | 11/1998 | Osakabe et al. |
| 5,836,381 A | 11/1998 | Osakabe et al. |
| 5,953,930 A | 9/1999 | Chu et al. |
| 6,055,157 A | 4/2000 | Bartilson |
| 6,223,810 B1 | 5/2001 | Chu et al. |
| 6,657,121 B1 * | 12/2003 | Garner ...................... 174/16.3 |
| 6,972,365 B1 * | 12/2005 | Garner ...................... 174/16.3 |

FOREIGN PATENT DOCUMENTS

| | | |
|---|---|---|
| JP | 09069595 A | 3/1997 |
| SU | 788461 | 12/1980 |

* cited by examiner

THERMAL MANAGEMENT SYSTEM AND METHOD FOR ELECTRONICS SYSTEM

This application is a continuation application of U.S. application Ser. No. 10/658,828, filed Sep. 9, 2003 now U.S. Pat. No. 6,972,365, which itself is a continuation application of U.S. application Ser. No. 10/180,166, filed on Jun. 26, 2002 now U.S. Pat. No. 6,657,121 which itself claims priority from copending Provisional Patent Application Ser. No. 60/301,224, filed Jun. 27, 2001, and entitled Loop Thermosyphons And Their Applications To High Density.

FIELD OF THE INVENTION

The present invention generally relates to the management of thermal energy generated by electronic systems, and more particularly to a packaging scheme for efficiently and cost effectively routing and controlling the thermal energy generated by various components of an electronic system.

BACKGROUND OF THE INVENTION

The electronics industry, following Moore's Law, has seemed to be able to defy the laws of economics by providing ever increasing computing power at less cost. However, the industry has not been able to suspend the laws of physics inasmuch as high computing performance has been accompanied by increased heat generation. Board level heat dissipation has advanced to a point that several years ago was only seen at the system level. The trend toward ever increasing heat dissipation in microprocessor and amplifier based systems, such as are housed in telecommunication and server port cabinets, is becoming increasingly critical to the electronics industry. In the foreseeable future, finding effective thermal solutions will become a major constraint for the reduction of system cost and time-to-market, two governing factors between success and failure in commercial electronics sales.

The problems caused by the increasing heat dissipation are further compounded by the industry trend toward system miniaturization—one of the main methodologies of the electronics industry to satisfy the increasing market demand for faster, smaller, lighter and cheaper electronic devices. The result of this miniaturization is increasing heat fluxes. For example, metal oxide semiconductor-controlled thyristors may generate heat fluxes from 100 to 200 $W/cm^2$, some high voltage power electronics for military applications may generate heat fluxes of 300 $W/cm^2$, while some laser diode applications require removal of 500 $W/cm^2$. Also, non-uniform heat flux distribution in electronics may result in peak heat fluxes in excess of five times the average heat flux over the entire semiconductor chip surface (~30 $W/cm^2$).

Thus, as clock speeds for integrated circuits increase, package temperatures will be required to correspondingly decrease to achieve lower junction temperatures. However, increasing package temperatures will result from the increase in heat dissipation in the package from higher clock speed devices. This increase in temperature will cascade throughout the interior of the structure that encloses or houses such circuits, (e.g. a typical telecommunications or server port cabinets, or the like) as the number of high power semiconductor components positioned within the housing increases. The difference between these physical aspects (i.e., the difference between the interior cabinet temperature and the package temperature) of the electronic system defines a "thermal budget" that is available for the design of the cooling devices/systems needed to manage the heat fluxes generated by the various electronic devices in the system. As these two conflicting parameters converge, the available thermal budget shrinks. When the thermal budget approaches zero, refrigeration systems become necessary to provide the requisite cooling of the electronic system.

It is well known to those skilled in the art that thermal resistances (often referred to as "delta-T") for typical thermal systems at the semiconductor junction-to-package, package-to-sink and sink-to-air levels have been trending up over the past decade. The lack of understanding of microscale heat transfer physics, the requirement of matching the coefficients of thermal expansion (C.T.E.'S) of a semiconductor chip and the thermal energy spreading materials and the potential adverse effect on conventional packaging practices of integrating heat transfer mechanisms into packages, have largely limited the choice of cooling/spreading techniques at the semiconductor chip and semiconductor package levels to heat conduction.

Extensive efforts in the areas of heat sink optimization (including the use of heat pipes) and interface materials development in the past have resulted in the significant reduction of sink-to-air and package-to-sink thermal resistances. However, the reduction of these two thermal resistances has now begun to approach the physical and thermodynamic limitations of the materials. On the other hand, the junction-to-package thermal resistance (delta-T) has increased recently, due to the increasing magnitude and non-uniformity (localization) of the heat generation and dissipation from the semiconductor package.

Successful cooling technologies must deal with thermal issues at the device, device cluster, printed wiring board, subassembly, and cabinet or rack levels, all of which are within the original equipment manufacturer's (OEM's) products. Many times, the problem is further complicated by the fact that the thermal solution is an "after thought" for the OEM. A new equipment design may utilize the latest software or implement the fastest new semiconductor technology, but the thermal management architecture is generally relegated to the "later phases" of the new product design. The thermal management issues associated with a designed electronic system are often solved by the expedient of a secondary cooling or refrigeration system that is arranged in tandem with the electronics system.

There are several negatives associated with the use of tandem cooling or refrigeration systems. The additional electrical power required by such systems not only increases the cost to operate the electronic equipment, but also causes an adverse environmental impact in the form of pollution (from power generation processes) and noise. Reliability issues are also of considerable concern with refrigeration systems. In addition, such add-on thermal management solutions can make after market servicing very difficult and expensive. There is a need for a thermal management system that can be easily disassembled from the underlying electronic system, in the field, to facilitate servicing of the components.

There is a compound challenge in the art to provide a thermal management architecture that satisfactorily accumulates and transfers variable amounts of thermal energy, generated by a wide variety of electronic components arranged together in an enclosed space, while avoiding or minimizing the use of non-passive, tandem cooling or refrigeration systems for cooling. As a consequence, there is also a need in the art for a cost effective, integral thermal management architecture for high power electronic systems and that is easily removed during servicing.

SUMMARY OF THE INVENTION

The present invention provides a thermal energy management system comprising a heat spreading device that is operatively engaged with at least one semiconductor chip. A thermal bus is operatively engaged with the heat spreading device so as to transport thermal energy from the heat spreading device to a heat sink. In one preferred embodiment, the heat spreading device comprises a heat pipe and a thermal bus is provided that comprises a loop thermosyphon. In another embodiment of the invention, a second thermal bus is operatively engaged with the first thermal bus so as to transport thermal energy from the first thermal bus to a heat sink. The second thermal bus may also comprise a loop thermosyphon.

A method of managing thermal energy in an electronic system is provided that includes spreading thermal energy generated by one or more devices over a surface that is relatively larger than the devices, thermally coupling an evaporator portion of a loop thermosyphon to the surface, and thermally coupling a condensing portion of the loop thermosyphon to a thermal energy sink, e.g., a second loop thermosyphon, convection fin, or cold plate.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts and further wherein.

DETAILED DESCRIPTION OF THE PREFERRED EMBODIMENT

Figure 1:
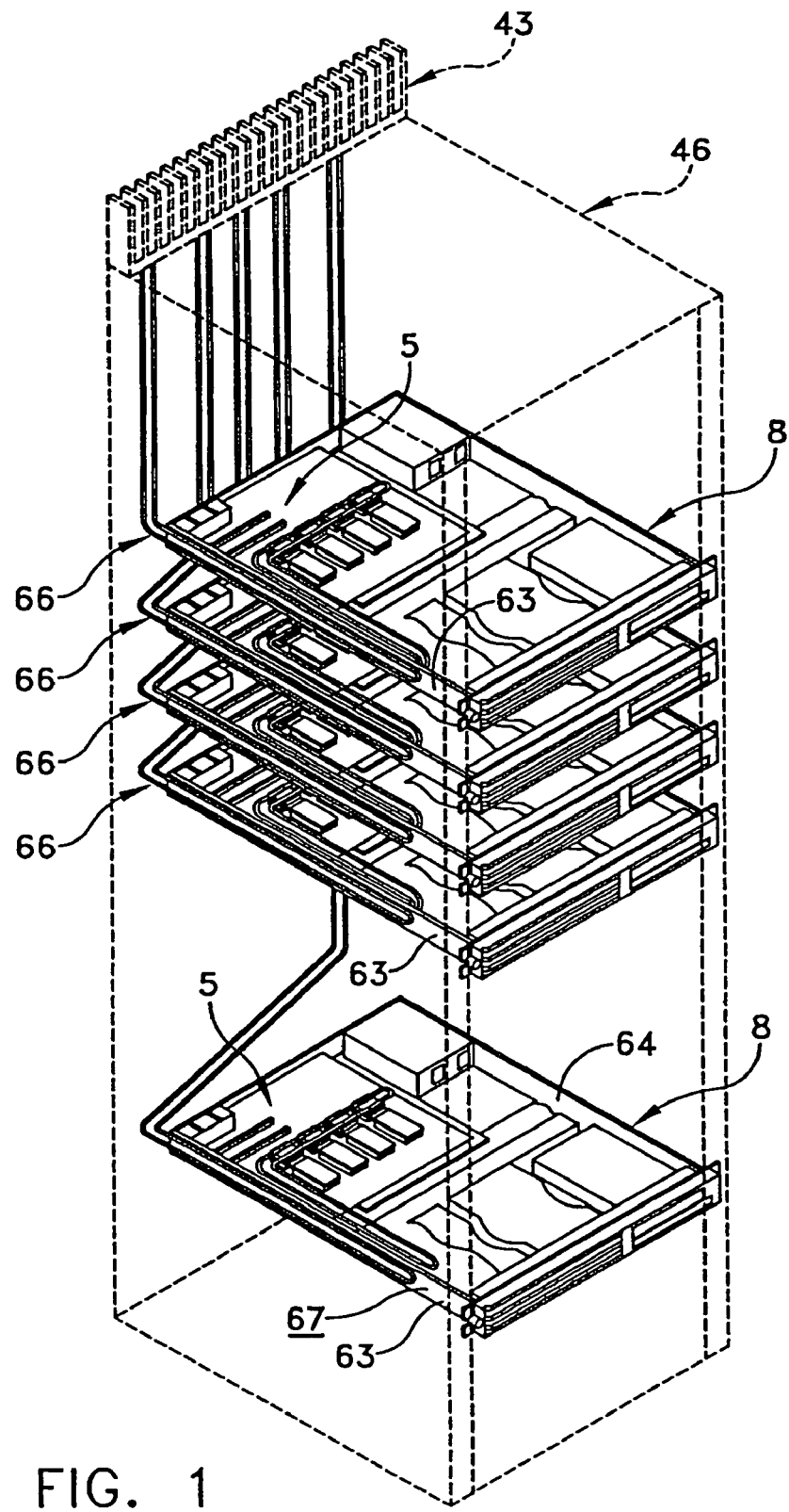
FIG. 1 is a perspective view, partially in phantom, of a typical electronics system including a thermal management system formed in accordance with one embodiment of the present invention.

This description of preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. In the claims, means-plus-function clauses are intended to cover the structures described, suggested, or rendered obvious by the written description or drawings for performing the recited function, including not only structural equivalents but also equivalent structures.

Referring to FIG. 1, the present invention provides a thermal energy management system 5 that may be implemented in a functioning system of electronic components and/or subsystems e.g., a 1-U server 8. Thermal energy management system 5 generally comprises a hierarchical scheme of thermal management components that are operatively engaged with individual heat generating components or groups of such components that form server 8. Advantageously, the thermal management components are substantially only thermally driven, i.e., passive heat transfer devices that have no moving parts and require no external power for their operation.

Figure 2:
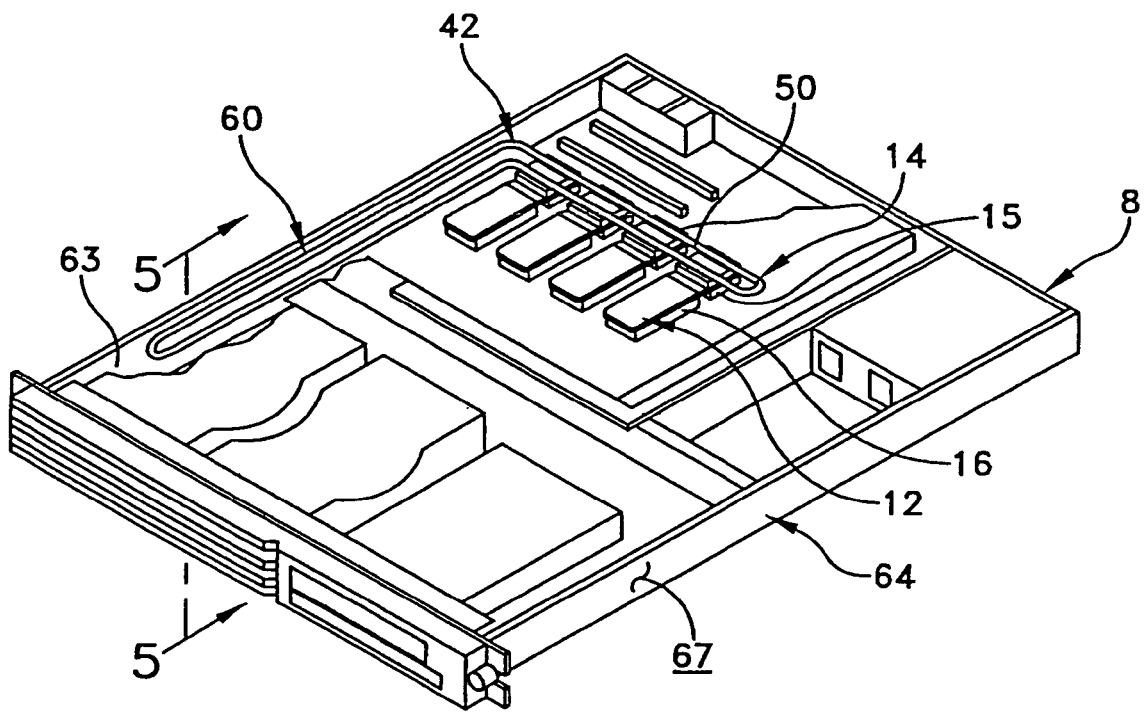
FIG. 2 is a perspective view of a typical electronics subsystem incorporating the thermal management system of the present invention.
Figure 3:
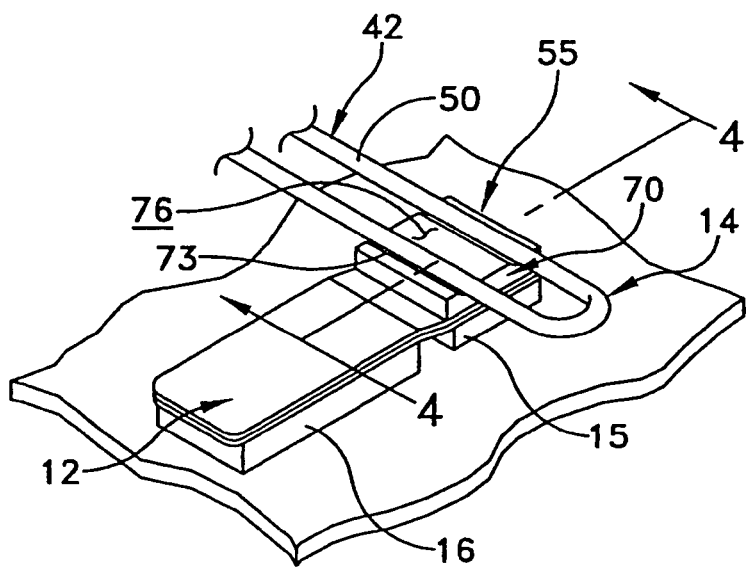
FIG. 3 is a perspective, broken-away view of a portion of the electronics subsystem shown in FIG. 2.
Figure 4:
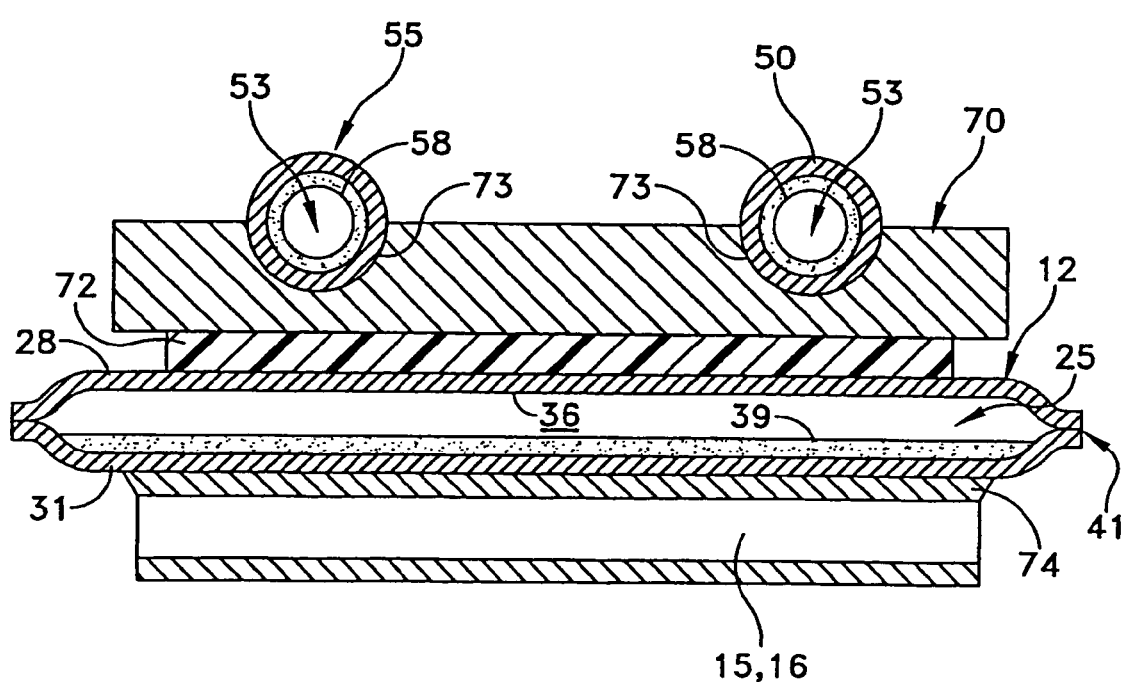
FIG. 4 is a cross-sectional view, as taken along line 4—4 in FIG. 3, of a thermal bus, evaporator plate, heat pipe, and heat generating electronic component.

Referring to FIGS. 2–4, thermal energy management system 5 comprises a planar heat pipe 12 arranged in thermal communication with a thermal bus 14 for transporting thermal energy away from individual heat generating devices 15,16 as well as, clusters of such devices within the electronic system. More particularly, planar heat pipe 12 is sized and shaped so as to spread the thermal energy generated by at least one semiconductor device 15,16 that is arranged in intimate thermal engagement with planar heat pipe 12 within server 8. Often, one or more semiconductor devices 15,16 e.g., microprocessors, voltage regulators, power supplies, etc., are mounted within the same region of the electronics system.

Referring to FIG. 4, planar heat pipe 12 comprises a vapor chamber 25 that is defined between a top wall 28 and a bottom wall 31, and extends transversely and longitudinally throughout planar heat pipe 12. In a preferred embodiment, top wall 28 and bottom wall 31 comprise substantially uniform thickness sheets of a thermally conductive material, and are spaced-apart by about 2.0 (mm) to about 4.0 (mm) so as to form the void space within heat pipe 12 that defines vapor chamber 25. Top wall 28 preferably comprises a substantially planer inner surface 36. Bottom wall 31 of planar heat pipe 12 is also substantially planar, and comprises an integrally formed layer of wicking material, or wick 39. In one embodiment, sintered copper powder or felt metal wick structure, having an average thickness of about 0.5 mm to 2.0 mm is positioned over substantially all of the inner surface of bottom wall 31 so as to form wick 39. Of course, other wick materials, such as, aluminum-silicon-carbide or copper-silicon-carbide may be used with equal effect.

Vapor chamber 25 is created by the attachment of top wall 28 and bottom wall 31, along their common edges which are then hermetically sealed at their joining interface 41. A two-phase vaporizable liquid (e.g., ammonia or freon not shown) resides within vapor chamber 25, and serves as the working fluid for planar heat pipe 12. Heat pipe 12 is formed by drawing a partial vacuum within vapor chamber 25 and injecting the working fluid just prior to final hermetic sealing of the common edges of top wall 28 and bottom wall 31. For example, planar heat pipe 12 (including top wall 28 and bottom wall 31) may be made of copper or copper silicon carbide with water, ammonia, or freon generally chosen as the two-phase vaporizable liquid.

Referring to FIGS. 1–5, thermal bus 14 comprises a loop-thermosyphon 42 that is thermally engaged with planar heat pipe 12 so as to bus thermal energy from planar heat pipe 12 to a thermal energy sink or heat sink 43, e.g., a cold plate or convection cooled fin stack. In the context of the present invention, terms such as "bus, buses, or busing" mean to transport or otherwise transfer thermal energy in a directed manner from one location to another location, e.g., from a high heat flux portion to a lower heat flux portion of a rack/chassis assembly 46 that structurally supports a plurality of servers 8.

Loop thermosyphon 42 comprises a closed tube 50 that is formed from a substantially uniform thickness, thermally conductive material (e.g., copper, aluminum, or the like) having a continuous internal passageway 53. At least an evaporator portion 55 of tube 50 includes an integrally formed wicking layer 58 of sintered copper powder or metal felt, having an average thickness of about 0.5 mm to 2.0 mm. Wicking layer 58 is continuously disposed over substantially all of the inner surface of tube 50 at evaporator portion 55. A condensing portion 60 of tube 50 is positioned in spaced away relation to evaporator portion 55, and often arranged in intimate thermal contact with a wall 63 of a support chassis 64 of server 8. Loop thermosyphon 42 is maintained in position within server 8 by means of simple fasteners, e.g., screws and brackets, so that it may be disassembled from the underlying electronic system and components so that they may be serviced without need for time consuming and error prone reassembly of the system.

A two-phase vaporizable liquid (e.g., ammonia, water, freon or the like, not shown) resides within passageway 53 of loop thermosyphon 42, and serves as the working fluid. Loop thermosyphon 42 may be formed by drawing a partial vacuum within tube 50 and injecting the working fluid just prior to final hermetic sealing of the tube. Condensing portion 60 of tube 50 may or may not include an integrally formed wicking layer 58. The evaporator portions 65 of one or more additional loop-thermosyphons 66 may be located on the outer surface 67 of wall 63 so as to (i) receive thermal energy from condensing portion 60 of loop-thermosyphon 42, via thermal conduction through wall 63, and (ii) bus that thermal energy to other lower heat flux regions of a rack/chassis assembly 46. Loop thermosyphon 66 is also maintained in position within on chassis 46 by means of simple fasteners, e.g., screws and brackets, so that it may be quickly disassembled from the underlying electronic system and chassis for servicing.

Evaporator plates 70 provide a physical and thermal interface between top wall 28 of planar heat pipe 12 and evaporator portion 55 of loop-thermosyphon 42, and between wall 63 and evaporator portion 65 of loop-thermosyphon 66. More particularly, evaporator plate 70 is formed from a substantially uniform thickness sheet of a thermally conductive material, and is preferably substantially planar. It is sized and shaped to cover a portion of top wall 28 of planar heat pipe 12, or the portion of wall 63 adjacent to evaporator portions 65 of loop-thermosyphon 66. The outer surface of bottom wall 31 may be either permanently bonded to heat generating devices 15,16, or a thermal grease or other heat transfer material may be disposed at the thermal interface 72 between evaporator 70 and heat generating devices 15,16. At least two grooves 73 are formed in a top surface 76 of evaporator plate 70 so as to receive and cradle evaporator portion 55 of loop-thermosyphon 42, or evaporator portion 65 of loop-thermosyphon 66. A thermal grease or other heat transfer material may be disposed at the thermal busing interface 79 between evaporator portion 65 of loop-thermosyphon 66 and condensing portion 60 of loop thermosyphon 42, and wall 63. A mechanical locking mechanism 80 may also be employed to help force evaporator plate 70 into intimate thermal engagement and communication with wall 63 so as to enhance heat transfer across this thermo-mechanical interface.

In one example, thermal management system and method 5 of the present invention was used for cooling four McKinley processors in a 1-U rack mount system. Four McKinley processors 15 and four associated power supplies 16 in a 1-U rack mount system with forty-two systems per rack. Each processor generates one hundred and thirty watts of thermal energy, each power supply generates forty-five watts, each central processing unit generates one hundred and seventy-five watts, so that each server yields about seven hundred watts of thermal energy, with a total power output for the rack equal to about twenty-nine thousand four hundred watts. The allowable thermal resistance is based upon a $T_c$ max equal to about eighty-five degrees centigrade. Assuming an allowable ambient temperature of thirty-five degrees centigrade, the rate of power generation from the overall system, that is allowable to remain within specifications, is about 0.38 watts per degree centigrade.

Referring to FIGS. 1 and 2, the thermal busing path from server 8 to heat sink 43 starts at first thermal interface 74 between the case or package containing the first McKinley processor 15 and bottom wall 31 of heat pipe 12 (FIG. 4). In this embodiment of the invention, heat pipe 12 extends across both the McKinley processor 15 and its associated power supply pod 16 so as to spread thermal energy over an area larger than the area of at least one of these heat generating components, i.e., heat pipe heat spreader 12 preferably comprises a larger area than processor 15 and its associated power supply pod 16. Heat is transferred across first thermal interface 74 to bottom wall 31, through vapor chamber 25, to top wall 28. Heat pipe 12 is often permanently attached to at least processor 15 by e.g., solder or brazing, such that first thermal interface 74 permanently attaches processor 15 to the outer surface of bottom wall 31. A second thermal interface 72 is provided between the bottom surface of evaporator 70 and the outer surface of top wall 28. A thermal grease or other heat transfer material may be disposed at thermal interface 72. This arrangement of heat pipes 12 and evaporator plates 70 is duplicated across all four McKinley processors 15 and associated power supplies 16 in the 1-U rack mount system.

Evaporator portion 55 of flexible loop thermosyphon 42 is then assembled to each evaporator plate 70 via placing tube 50 into grooves 73 on top surfaces 76. Flexible loop thermosyphon 42 is maintained in place on evaporators 70 by means of simple fasteners that are easily removed for servicing. The heat transferred from heat pipes 12 actually creates a series of multiple evaporator portions 55 along the length of flexible loop thermosyphon 42. This interface between heat pipe 12 and flexible loop thermosyphon 42 is thus a detachable thermal joint so as to allow for the replacement of processor 15 and power supply module 16. Flexible loop thermosyphon 42 transfers all the heat generated by the four McKinley processors 15 and four associated power supplies 16 to side wall 63 of the 1-U server 8 which provides lower thermal flux region for condenser portion 60 of flexible loop thermosyphon 42 (FIG. 5).

Figure 5:
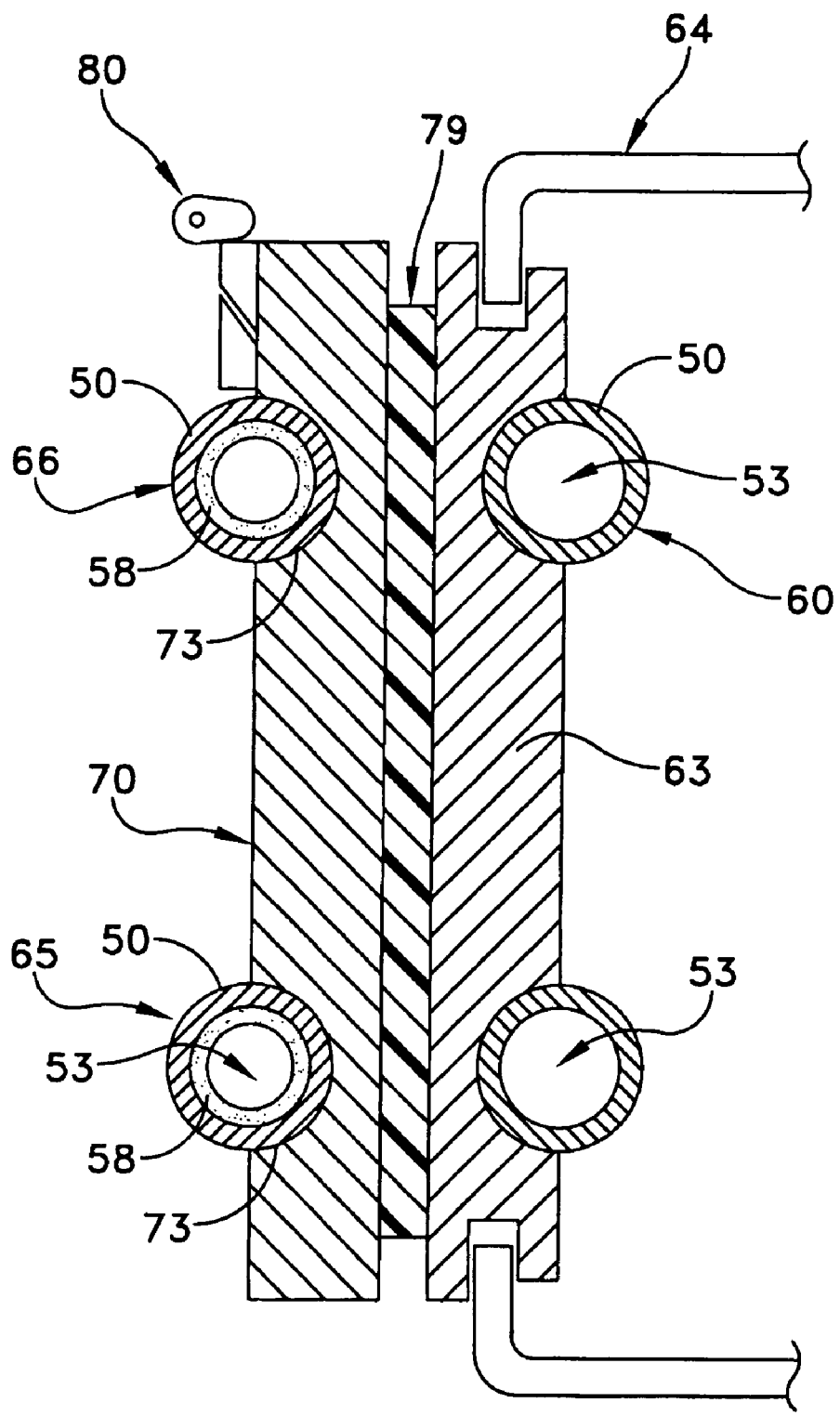
FIG. 5 is a cross-sectional view, as taken along line 5—5 in FIG. 2, of a thermal bus to thermal bus interface.

Since server chassis' 64 need to be removable, a third thermal interface 79 is provided between wall 63 and an evaporator plate 70 that is cradling evaporator portion 65 of loop thermosyphon 66 (FIG. 5). This interface is often enhanced by use of a cam-type mechanical locking mechanism 80 that aids in forcing evaporator plate 70 into intimate thermal engagement and communication with wall 63 so as to enhance heat transfer across this thermo-mechanical interface.

In this way, loop thermosyphon 66 transfers the heat to the top of rack 46 where it can be dissipated to a large air-cooled heat sink 43, or coupled to a re-circulated water or refrigeration cooled heat sink. For clarity of illustration, the details of the condenser integration are not shown in the various figures, however, a simple tube-in-fin type heat exchanger could easily be integrated.

In this example, the use of thermal management system and method 5 yielded an overall system temperature rise is 21.6 degrees C., which corresponds to a thermal resistance of 0.166 degrees C./watt based on the 130 watts processor power. Assuming a 50 degrees C. allowable case to ambient temperature rise leaves 28.4 degrees C. available to dissipate the transferred heat from the condenser of loop thermosyphon 66 to the ambient air.

ADVANTAGES OF THE INVENTION

Numerous advantages are obtained by employing the present invention.

More specifically, a thermal energy management system comprising a hierarchical scheme of thermal management components that are operatively engaged with individual components or groups of components that form an electronic system is provided which avoids all of the aforementioned problems associated with prior art systems for managing thermal energy generated by electronic systems.

In addition, a thermal energy management system is provided that incorporates discrete heat spreading technologies at the semiconductor device and semiconductor device package that enables the package temperature to increase without overheating at the junction level while incorporating a thermal bus for transporting or otherwise transferring thermal energy in a directed manner from one location to another location, e.g., from the high heat flux portion of a semiconductor to a lower heat flux portion of an external heat sink.

Also, a thermal energy management system is provided that is easily disassembled from the underlying electronic system and components so that they may be serviced without need for time consuming and error prone reassembly.

It is to be understood that the present invention is by no means limited only to the particular constructions herein disclosed and shown in the drawings, but also comprises any modifications or equivalents within the scope of the claims

The invention claimed is:

1. A thermal energy management system comprising:
a planar heat pipe having a first outer surface that is operatively engaged with at least one heat generating component wherein said planar heat pipe is sized and shaped so as to spread thermal energy over an area larger than the area of said at least one heat generating component; and
a thermal bus including an evaporator plate that is operatively engaged with a second outer surface of said planar heat pipe so as to transport thermal energy from said planar heat pipe to a heat sink, said thermal bus including a tubular evaporator portion of a loop-thermosyphon wherein at least one groove is formed in a top surface of said evaporator plate so as to receive and cradle said evaporator tube of said loop-thermosyphon.

2. A thermal energy management system according to claim 1 including a second thermal bus that is operatively engaged with said thermal bus so as to transport thermal energy from said first thermal bus to said heat sink.

3. A thermal energy management system according to claim 2 wherein said second thermal bus comprises a second loop thermosyphon.

4. A thermal energy management system according to claim 1 wherein said heat planar pipe comprises a vapor chamber that is defined between a top wall formed from a substantially uniform thickness sheet of a thermally conductive material and a bottom wall comprises a substantially uniform thickness sheet of a thermally conductive material.

5. A thermal energy management system according to claim 1 wherein said thermal bus comprises a tubular evaporator portion of at least two loop-thermosyphons wherein each tubular evaporator portion is thermally engaged with said planar heat pipe so as to bus thermal energy to a thermal energy sink.

6. A thermal energy management system according to claim 5 wherein said at least two loop thermosyphons each comprise a condensing portion positioned in spaced away relation to each of said tubular evaporator portions.

7. A thermal energy management system according to claim 1 wherein said thermal bus comprises a loop thermosyphon formed from a closed tube having a continuous internal passageway and wherein said tubular evaporator portion includes an integrally formed wicking layer disposed on the surface of said tube that defines said internal passageway adjacent to said evaporator portion and said planar heat pipe.

8. A thermal energy management system according to claim 7 wherein said wicking layer comprises sintered copper powder having an average thickness of about 0.5 mm to 2.0 mm.

9. A thermal energy management system according to claim 1 wherein a portion of said thermal bus is arranged in intimate thermal contact with a wall of a support chassis.

10. A thermal energy management system according to claim 9 wherein said thermal bus is maintained in position by a simple fastening system so that it may be disassembled from an underlying electronic system and components.

11. A thermal energy management system according to claim 9 further comprising a second thermal bus positioned adjacent to a condensing portion of said thermal bus.

12. A thermal energy management system comprising:
a planar heat pipe heat spreader that is operatively engaged with at least one heat generating component;
an evaporator plate positioned between a portion of said planar heat pipe heat spreader and an evaporation tube of a first loop thermosyphon so as to transport thermal energy from said planar heat pipe heat spreader to a heat sink wherein at least one groove is formed in a top surface of said evaporator plate so as to receive and cradle said evaporator tube of said loop-thermosyphon and further wherein said evaporator plate is formed from a substantially uniform thickness sheet of a thermally conductive material that is sized and shaped to cover a portion of said top surface; and
a second evaporator plate positioned between a condensing portion of said first loop thermosyphon and an evaporator tube of a second loop thermosyphon.

13. A thermal energy management system according to claim 12 wherein said evaporator plate provides a physical and thermal interface between a top wall of said planar heat pipe heat spreader and said evaporator tube of said loop-thermosyphon.

* * * * *